United States Patent
Keum

(10) Patent No.: US 6,753,718 B2
(45) Date of Patent: Jun. 22, 2004

(54) AUTO FUSING CIRCUIT

(75) Inventor: Dong-jin Keum, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/945,595

(22) Filed: Sep. 4, 2001

(65) Prior Publication Data

US 2002/0093373 A1 Jul. 18, 2002

(30) Foreign Application Priority Data

Jan. 15, 2001 (KR) .......................................... 2001-2172

(51) Int. Cl.[7] .............................................. H03K 3/037
(52) U.S. Cl. .................................... 327/525; 365/225.7
(58) Field of Search ................................ 327/525, 526, 327/403, 404; 326/37, 38; 365/96, 225.7, 200; 438/467

(56) References Cited

U.S. PATENT DOCUMENTS

| | | | | |
|---|---|---|---|---|
| 4,125,880 A | * | 11/1978 | Taylor | ......................... 365/242 |
| 4,937,465 A | * | 6/1990 | Johnson et al. | .............. 327/525 |
| 5,293,339 A | * | 3/1994 | Suzuki et al. | ................ 365/200 |
| 5,424,672 A | * | 6/1995 | Cowles et al. | ............... 327/525 |
| 5,610,865 A | * | 3/1997 | Shin et al. | ................... 365/200 |
| 5,933,376 A | * | 8/1999 | Lee | ............................. 365/200 |
| 6,014,052 A | * | 1/2000 | Coupe, II | .................... 327/525 |
| 6,246,243 B1 | * | 6/2001 | Audy | ......................... 324/550 |

* cited by examiner

Primary Examiner—Tuan T. Lam
(74) Attorney, Agent, or Firm—F. Chau & Associates, LLC

(57) ABSTRACT

An auto fusing circuit for automatically performing fusing operations by application of one time fuse enable signal is described. The auto fusing circuit includes a primary fuse block for receiving a fuse enable signal as an enable signal, and performing a fusing operation, and a plurality of secondary fuse blocks connected to an output terminal of the primary fuse block in series for respectively receiving an out signal of the previous fuse block as an enable signal, and sequentially performing fusing operations. The primary fuse block and the secondary fuse blocks are activated by an enable of each of select signals, or deactivated by a disable of each of the select signals. According to the auto fusing circuit, the fusing operations are sequentially performed with a single application of fuse enable signal, and a test time can be reduced.

13 Claims, 4 Drawing Sheets

AUTO FUSING CIRCUIT

BACKGROUND OF THE INVENTION

1. Technical Field

The present invention relates to a semiconductor device and, more particularly, to an auto fusing circuit for automatically performing fusing operations with a single application of a fuse enable signal.

2. Description of the Related Art

If a fusing operation is performed using a serial interface, then conventionally the fusing operation is performed by selecting a bit having a different logic value from a first specific logic value, and a fusing operation of the next bit is performed after waiting a predetermined time for completion of the first fusing operation. Here, if the number of bits on which the fusing operation will be performed is N, then it takes N multiplied by the performance time of a single fusing operation for performing the N fusing operations.

FIG. 1A is a circuit diagram illustrating a conventional fusing cell. The conventional fusing cell of FIG. 1A includes inverters 11 and 12 connected in series, a bipolar transistor (N1) connected in series between a source voltage (VDD) and an earth voltage (VSS), and a fuse (FU).

Describing the operation of the conventional fusing cell of FIG. 1a further, the inverters 11 and 12 receive a fuse enable signal (FEN), and apply the signal to a base of the bipolar transistor (N1). If the fuse enable signal (FEN) is at a logic high level, then the bipolar transistor (N1) turns on, a collector current (IC) is applied to the fuse (FU), and the fusing operation is performed.

FIG. 1B is a timing diagram illustrating the fusing operation of the fusing cell of FIG. 1A. If the fuse enable signal (FEN) is at the logic high level, then the bipolar transistor (N1) turns on, and the collector current (IC) is activated at the logic high level. Then, after a time of tO passes, the fusing operation is completed, and the collector current (IC) becomes logic low level.

If there are N fusing cells, and each of the fusing cells are fused, the fuse enable signal (FEN) is applied at the logic high level, and after waiting a time of tO, the fuse enable signal (FEN) of the next fusing cell is activated at the logic high level. Therefore, if the fusing operation is performed on all N fusing cells, the fusing operation takes NxtO, and fusing cells which perform fusing operations with the serial interface must be controlled every time.

SUMMARY OF THE INVENTION

To solve the above and other related problems of the prior art, there is provided an auto fusing circuit, in which fusing operations are sequentially performed with a single application of fuse enable signal, and a test time is reduced.

According to an aspect of the present invention, there is provided an auto fuse circuit. A primary fuse block receives a fuse enable signal as an enable signal, and performs a fusing operation. A plurality of secondary fuse blocks connected to an output terminal of the primary fuse block in series respectively receive an output signal of a previous fuse block as the enable signal, and sequentially perform fusing operations.

According to another aspect of the present invention, the primary fuse block and each of the plurality of secondary fuse blocks comprise logical multiplying means for logically multiplying the enable signal and a corresponding one of the select signals. A fusing cell block performs a fusing operation in response to an output signal of the logical multiplying means. A multiplexer selects one of an output signal of the fusing cell block and the enable signal as a fuse block output signal in response to the corresponding one of the select signals.

Therefore, the auto fusing circuit according to the present invention has advantages in that the fusing operations are sequentially performed with a single application of a fuse enable signal, and a test time can be reduced.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF PREFERRED EMBODIMENTS

Figure 1A:
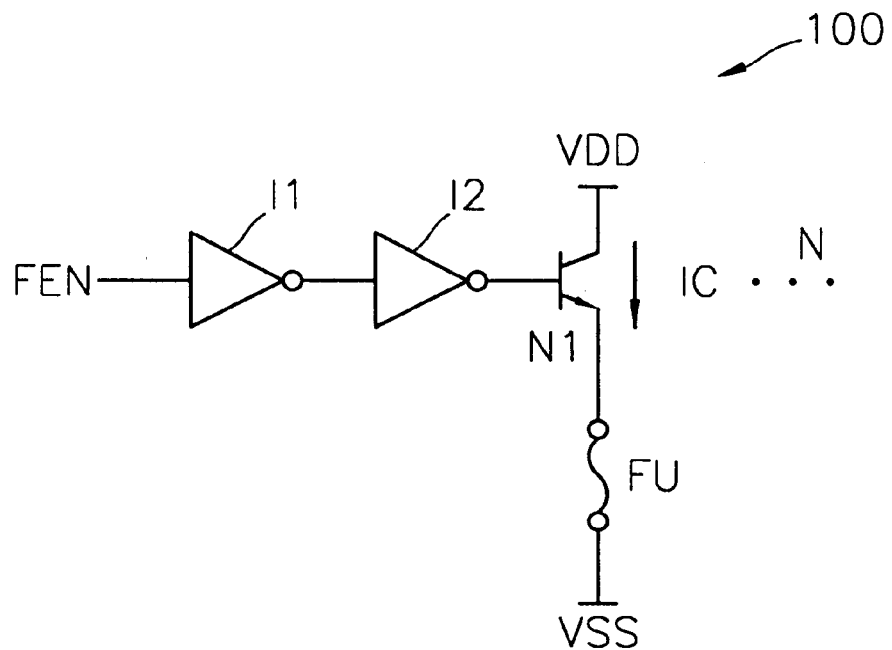
FIG. 1A is a circuit diagram illustrating a conventional fusing cell.
Figure 1B:
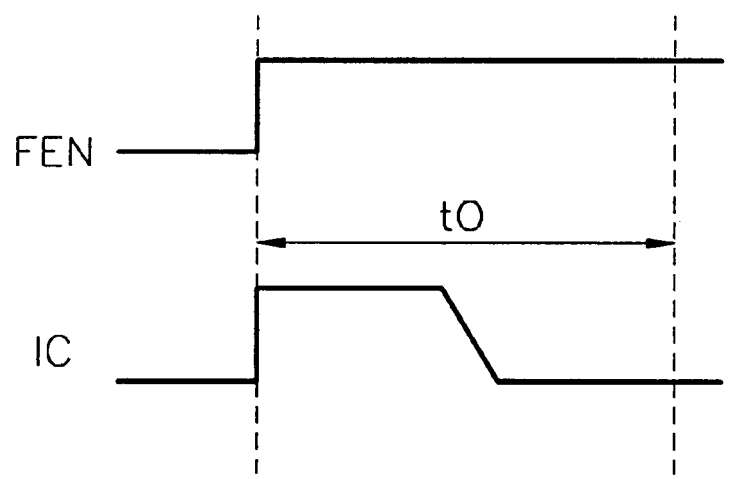
FIG. 1B is a timing diagram illustrating a fusing operation of the fusing cell of FIG. 1A.

Hereinafter, a preferred embodiment of the present invention will be described in detail with reference to the accompanying drawings. The same reference numerals in different drawings represent the same element.

Figure 2A:
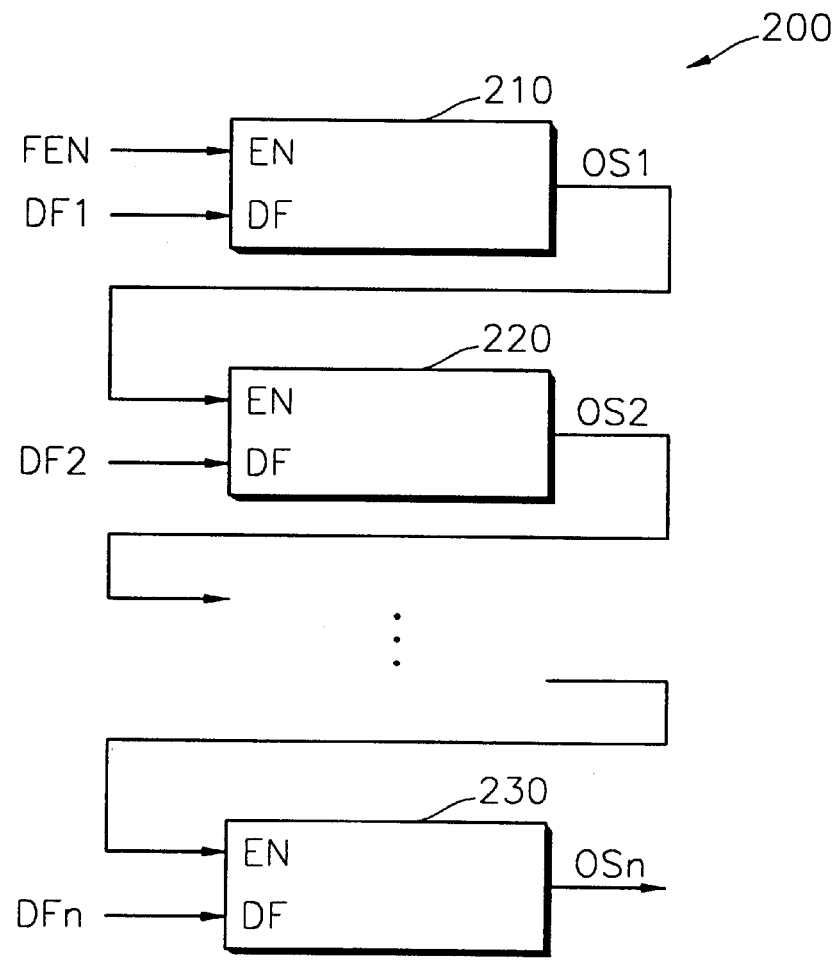
FIG. 2A is a block diagram illustrating an auto fuse circuit according to an illustrative embodiment of the present invention.

Referring to FIG. 2A, an auto fuse circuit 200 according to the present invention includes a primary fuse block 210 and a plurality of secondary fuse blocks 220 and 230.

The primary fuse block 210 receives a fuse enable signal (FEN) as an enable signal (EN), and performs a fusing operation. The plurality of secondary fuse blocks 220 and 230 are connected to an output terminal of the primary fuse block 210 in series, and each of the secondary fuse blocks receives an output signal (OS1, OS2, etc.) of the previous fuse block and performs a fusing operation. The primary fuse block 210 and the plurality of secondary fuse blocks 220 and 230 are activated by an enable of each of select signals (DF1, DF2, ..., DFn) or deactivated by a disable of each of the select signals (DF1, DF2, ..., DFn).

Figure 2B:
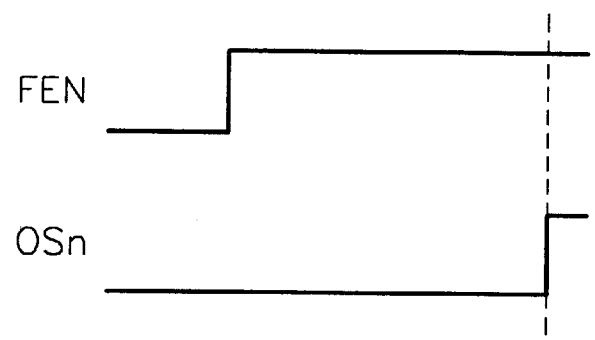
FIG. 2B is a timing diagram illustrating the case where fusing operation of the auto fuse circuit of FIG. 2A is completed, according to an illustrative embodiment of the present invention.

Referring to FIGS. 2A and 2B, the operation of the auto fuse circuit 200 will be described further. The select signals (DF1, DF2, ..., DFn) are signals for selecting whether a fusing operation will be performed or not. The select signals (DF1, DF2, ..., DFn) of the logic high level are input to fuse blocks in which a fusing operation will be performed, and the select signals (DF1, DF2, ..., DFn) of the logic low level are input to fuse blocks in which a fusing operation is not needed. That is, if the select signals (DF1, DF2, ..., DFn) are at the logic high level, then the fusing operation is performed by the fuse enable signal (FEN), and if the select signals (DF1, DF2, ..., DFn) are at the logic low level, then the fuse enable signal (FEN) is by-passed to the next fuse block.

If the fuse enable signal (FEN) is applied at the logic high level, and the fusing operation of the primary fuse block 210 is completed, then the output signal (OS1) is output at the logic high level. The output signal (OS1) is input as an enable signal (EN) of the secondary fuse block 220 of the next terminal. Even if the fusing operation is not performed, the output signal (OS1) is output at the logic high level, so that the output signals (OS1, OS2, ..., OSn) are applied as enable signals (EN) of the next fuse block. After fusing operations are sequentially performed, the output signal (OSn) of the last fuse block 230 is output at the logic high level, and the operation of the entire auto fuse circuit 200 is completed.

Figure 3:
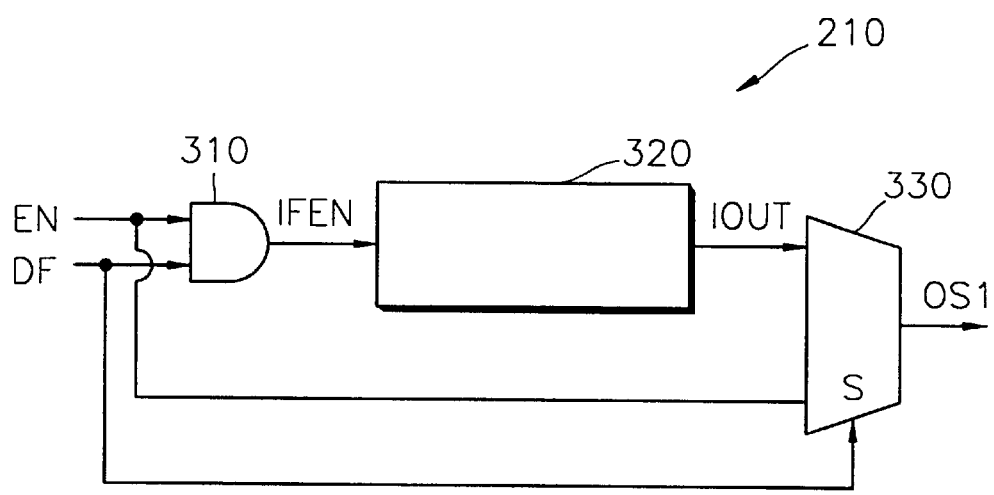
FIG. 3 is a circuit diagram illustrating an internal circuit of a fuse block of FIG. 2A, according to an illustrative embodiment of the present invention.

FIG. 3 is a circuit diagram illustrating the internal circuit of the fuse blocks shown in FIG. 2A. The fuse blocks 210, 220, and 230 are comprised of the same circuit, and thus only the first fuse block 210 will be described here. Referring to FIG. 3, the fuse block 210 of FIG. 2A includes a logical multiplying means 310, a fusing cell block 320, and a multiplexer 330. The logical multiplying means 310 logically multiplies the enable signal (EN) and the corresponding select signal (DF). The fusing cell block 320 performs a fusing operation in response to an output signal (IFEN) of the logical multiplying means 310. The multiplexer 330 selects and outputs one of an output signal (IOUT) of the fusing cell block 320 and the enable signal (EN) as an output signal (OS1) in response to the select signal (DF). The select signal (DF) is applied to a switch (S) of the multiplexer 330, and if the select signal (DF) is at the logic high level, then the output signal (IOUT) of the fusing cell block is selected, and if the select signal (DF) is at the logic low level, then the enable signal (EN) is selected and output.

More particularly, if the fuse enable signal (FEN) is applied as the enable signal (EN) at the logic high level, and the select signal (DF) is applied at the logic high level, then the output signal (IFEN) of the logical multiplying means 310 is generated at the logic high level, and the fusing operation of the fusing cell block 320 is performed. The fusing operation is completed, and the fusing cell block 320 generates the output signal (IOUT) at the logic high level. Since the select signal (DF) is at the logic high level, the multiplexer 330 selects the output signal (IOUT) of the fusing cell block 320, and outputs it as the output signal (OS1) of the fuse block 210.

If the fuse enable signal (FEN) is applied as the enable signal (EN) at the logic high level, and the select signal (DF) is applied at the logic low level, then the output signal (IFEN) of the logical multiplying means 310 is generated at the logic low level, and the fusing operation of the fusing cell block 320 is not performed. Therefore, the fusing cell block 320 generates the output signal (IOUT) at the logic low level. Since the select signal (DF) is at the logic low level, the multiplexer 330 selects the enable signal (EN), and outputs the enable signal (EN) as the output signal (OS1) of the fuse block 210. Here, since the enable signal (EN) is at the logic high level, the output signal (OS1) of the multiplexer 330 becomes the logic high level, so that the output signal (OS1) is used as the enable signal (EN) of the next fuse block 220.

Figure 4A:
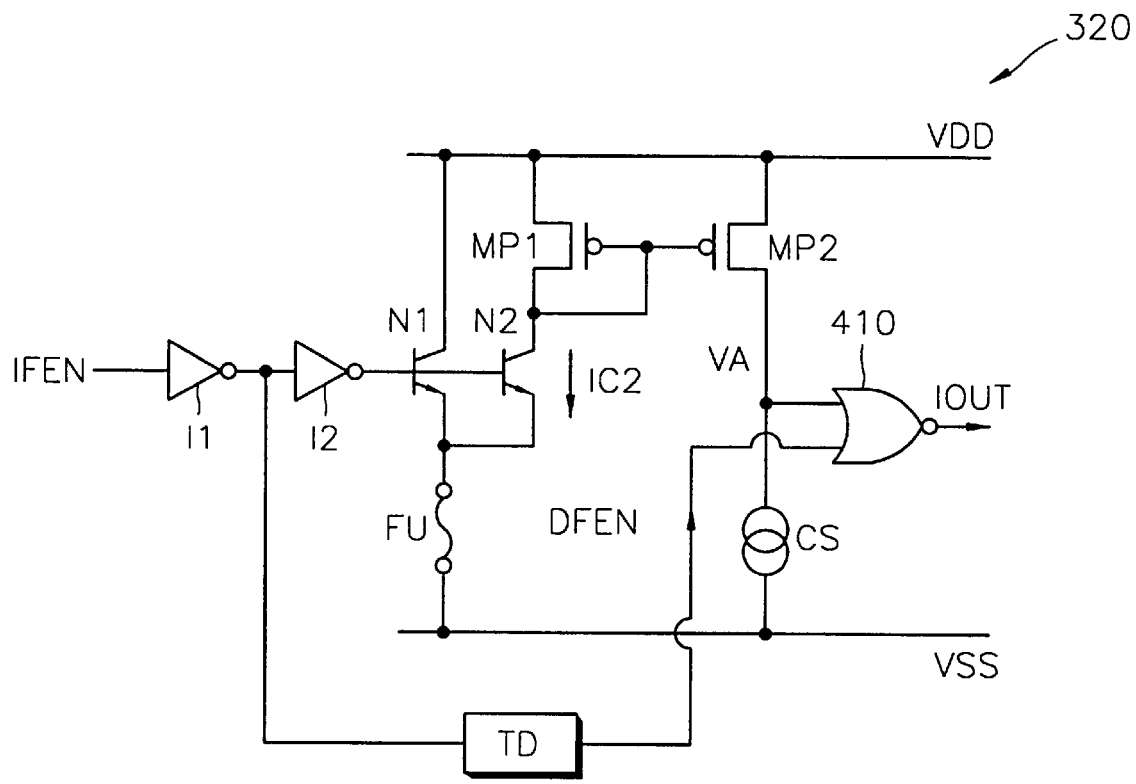
FIG. 4A is a circuit diagram illustrating a fusing cell block of FIG. 3, according to an illustrative embodiment of the present invention.

Referring to FIG. 4A, the fusing cell block 320 includes a first inverter (I1), a second inverter (I2), a first bipolar transistor (N1), a first PMOS transistor (MP1), a second bipolar transistor (N2), a fuse (FU), a second PMOS transistor (MP2), a current source (CS), a delay element (TD), and an invert logical adding means 410.

The first inverter (I1) receives and inverts the output signal (IFEN) of the logical multiplying means 310. The second inverter (I2) inverts the output signal of the first inverter (I1). One end of the first bipolar transistor (N1) is connected to the source voltage (VDD), and an output of the second inverter (I2) is applied to the base of the first bipolar transistor (N1). A source of the first PMOS transistor (MP1) is connected to the source voltage (VDD), and a gate and a drain of the first PMOS transistor (MP1) are connected to each other. One end of the second bipolar transistor (N2) is connected to the drain of the first PMOS transistor (MP1), the output of the second inverter (I2) is applied to the base of the second bipolar transistor (N2), and the other end of the second bipolar transistor (N2) is connected to another end of the first bipolar transistor (N1). The fuse (FU) is connected to the other ends of the first and second bipolar transistors (N1, N2). A source of the second PMOS transistor (MP2) is connected to the source voltage (VDD), and its gate is connected to a gate of the first PMOS transistor (MP1). One end of the current source (CS) is connected to the earth voltage (VSS), and the other end is connected to a drain of the second PMOS transistor (MP2). The delay element (TD) delays the output of the first inverter (I1) for a predetermined time. The invert logical adding means 410 logically adds and inverts the output signal (DFEN) of the delay element (TD) and a voltage signal (VA) of the drain of the second PMOS transistor (MP2), and outputs the result.

Figure 4B:
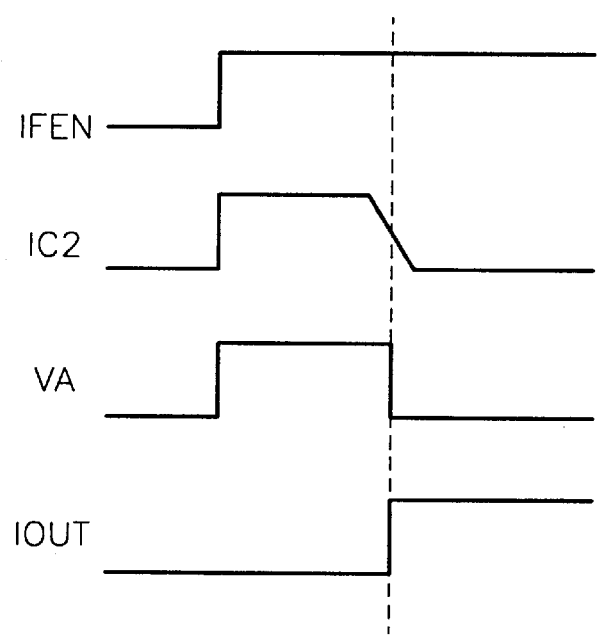
FIG. 4B is a timing diagram illustrating operation of the fusing cell block of FIG. 3, according to an illustrative embodiment of the present invention.

Referring to FIGS. 4A and 4B, operation of the fusing cell block 320 will be described more fully.

If the output signal (IFEN) of the logical multiplying means 310 is applied at the logic high level, the output signals of the first and second inverters (I1, I2) are applied to the gates of the first and second bipolar transistors (N1, N2). Since the gate and the drain of the first PMOS transistor (MP1) are connected to each other, the first PMOS transistor (MP1) always turns on. Therefore, if the first and second bipolar transistors (N1, N2) turn on, an electrical current flows from the source voltage (VDD) to the fuse (FU). Since the first and second PMOS transistors (MP1, MP2) have a current mirror relationship, an electrical current also flows in the second PMOS transistor (MP2). Here, if the electrical current which flows in the second PMOS transistor (MP2) is determined to be larger than the electrical current from the current source (CS), then a signal (VA) representing the voltage of the drain of the second PMOS transistor (MP2) becomes logic high. Therefore, the output (IOUT) of the invert logical adding means 410 becomes logic low. The fusing operation is performed by the electrical current which flows in the fuse (FU), and if the fuse (FU) is blown, then the electrical current (IC2) which flows in the second bipolar transistor (N2) decreases, so that the electrical current which flows in the second PMOS transistor (MP2) decreases. If the electrical current of the second PMOS transistor (MP2) becomes smaller than the electrical current from the current source (CS), then the signal (VA) representing the voltage of the drain of the second PMOS transistor (MP2) becomes logic low, an output of the invert logical adding means 410 becomes logic high, and the fusing operation is completed. After an output of the first inverter (I1) is delayed for a predetermined time through the delay element (TD), the delay signal (DFEN) is applied to the invert logical adding means 410. The time delay is a time required for making the voltage signal (VA) of the drain of the second PMOS transistor (MP2) logic high.

As described above, the auto fusing circuit according to the present invention has advantages in that fusing operations are sequentially performed by applying the fuse enable signal only once, and a test time can be reduced.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. An auto fuse circuit, comprising:

a primary fuse block for receiving a fuse enable signal as an enable signal to perform a fusing operation; and a plurality of secondary fuse blocks connected to an output terminal of the primary fuse block in series for respectively receiving an output signal of a previous fuse block as the enable signal to sequentially perform fusing operations, wherein the fuse enable signal is exclusively applied to the primary fuse block.

2. The auto fuse circuit of claim 1, wherein the primary fuse block and the plurality of secondary fuse blocks are activated by an enable of each of select signals, and deactivated by a disable of each of the select signals.

3. The auto fuse circuit of claim 2, wherein the primary fuse block and each of the plurality of secondary fuse blocks comprises:

logical multiplying means for logically multiplying the enable signal and a corresponding one of the select signals;

a fusing cell block for performing a fusing operation in response to an output signal of the logical multiplying means; and a multiplexer for selecting one of an output signal of the fusing cell block and the enable signal as a fuse block output signal in response to the corresponding one of the select signals.

4. The auto fuse circuit of claim 3, wherein the fusing cell block comprises:

a first inverter for receiving and inverting the output signal of the logical multiplying means;

a second inverter for inverting an output signal of the first inverter;

a first bipolar transistor having a first end and a base respectively connected to a source voltage and an output of the second inverter;

a first PMOS transistor having a gate and a drain interconnected, and a source connected to the source voltage;

a second bipolar transistor having a first end, a second end, and a base respectively connected to the drain of the first PMOS transistor, a second end of the first bipolar transistor, and the output of the second inverter;

a fuse having a first end and a second end respectively connected to an earth voltage and the second ends of the first and second bipolar transistors;

a second PMOS transistor having a gate and a source respectively connected to the gate of the first PMOS transistor and the source voltage;

a current source having a first end and a second end respectively connected to the earth voltage and a drain of the second PMOS transistor;

a delay element for delaying the output signal of the first inverter for a predetermined time; and invert logical adding means for logically adding and inverting an output signal of the delay element and a voltage signal of the drain of the second PMOS transistor, and outputting a result thereof.

5. The auto fuse circuit of claim 4, wherein the delay element delays the output of the first inverter until the voltage signal of the drain of the second PMOS transistor becomes a logic high.

6. An auto fuse circuit, comprising:

a primary fuse block; and a plurality of secondary fuse blocks, connected in series with respect to the primary fuse block and each other, wherein the primary fuse block and the plurality of second fuse blocks perform sequential fuse operations based upon a single application of a fuse enable signal that is received as an enable signal to the primary fuse block.

7. The auto fuse circuit of claim 6, wherein each of the plurality of secondary fuse blocks receive an output of a previous fuse block, if any, from among the primary fuse block and the plurality of secondary fuse blocks, as the enable signal.

8. The auto fuse circuit of claim 6, wherein the enable signal is maintained at a same logical level during the sequential fuse operations.

9. The auto fuse circuit of claim 6, wherein each of the primary fuse block and the plurality of secondary fuse blacks further comprises means for bypassing the enable signal to a next fuse block, if any, from among the primary fuse block and the plurality of secondary fuse blocks, when a fuse operation is not performed by a current fuse block.

10. The auto fuse circuit of claim 6, wherein the primary fuse block and the plurality of secondary fuse blocks are activated or deactivated, depending upon a state of a plurality of select signals.

11. The auto fuse circuit of claim 10, wherein the primary fuse block and the plurality of secondary fuse blocks each comprise:

logical multiplying means for logically multiplying the enable signal and a corresponding one of the plurality of select signals;

a fusing cell block for performing a fusing operation in response to an output signal of the logical multiplying means; and a multiplexer for selecting one of an output signal of the fusing cell block and the enable signal as a fuse block output signal in response to the select signal.

12. The auto fuse circuit of claim 11, wherein the fusing cell block comprises:

a first inverter for receiving and inverting the output signal of the logical multiplying means;

a second inverter for inverting an output signal of the first inverter;

a first bipolar transistor having a first end and a base respectively connected to a source voltage and an output of the second inverter;

a first PMOS transistor having a gate and a drain interconnected, and a source connected to the source voltage;

a second bipolar transistor having a first end, a second end, and a base respectively connected to the drain of the first PMOS transistor, a second end of the first bipolar transistor, and the output of the second inverter;

a fuse having a first end and a second end respectively connected to an earth voltage and the second ends of the first and second bipolar transistors;

a second PMOS transistor having a gate and a source respectively connected to the gate of the first PMOS transistor and the source voltage;

a current source having a first end and a second end respectively connected to the earth voltage and a drain of the second PMOS transistor;

a delay element for delaying the output signal of the first inverter for a predetermined time; and an invert logical adding means for logically adding and inverting an output signal of the delay element and a voltage signal of the drain of the second PMOS transistor, and outputting a result thereof.

13. The auto fuse circuit of claim 12, wherein the delay element delays the output of the first inverter until the voltage signal of the drain of the second PMOS transistor becomes a logic high.

* * * * *